(12) United States Patent
Little et al.

(10) Patent No.: US 8,107,581 B2
(45) Date of Patent: Jan. 31, 2012

(54) METHOD FOR FREQUENCY COMPENSATION IN TIMING RECOVERY

(75) Inventors: James M. Little, Sacramento, CA (US); Hiroshi Takatori, Sacramento, CA (US)

(73) Assignee: Vintomie Networks B.V., LLC, Dover, DE (US)

( * ) Notice: Subject to any disclaimer, the term of this patent is extended or adjusted under 35 U.S.C. 154(b) by 959 days.

(21) Appl. No.: 12/006,831

(22) Filed: Jan. 3, 2008

(65) Prior Publication Data
US 2009/0003504 A1 Jan. 1, 2009

Related U.S. Application Data

(60) Provisional application No. 60/900,180, filed on Feb. 7, 2007.

(51) Int. Cl.
*H03D 3/24* (2006.01)
(52) U.S. Cl. ........................................ 375/376
(58) Field of Classification Search ............ 375/215, 375/294, 327, 376; 342/103; 370/503; 455/180.3, 455/266; 327/141, 146, 147, 148, 149, 150, 327/156, 157, 158, 159
See application file for complete search history.

(56) References Cited

U.S. PATENT DOCUMENTS

| | | | |
|---|---|---|---|
| 7,272,175 B2 * | 9/2007 | Kim et al. | 375/226 |
| 7,405,628 B2 * | 7/2008 | Hulfachor et al. | 331/11 |
| 2004/0091069 A1 * | 5/2004 | Liu et al. | 375/350 |
| 2004/0232951 A1 * | 11/2004 | Tan et al. | 327/105 |
| 2007/0164798 A1 * | 7/2007 | Nikolov et al. | 327/156 |

* cited by examiner

*Primary Examiner* — Sam K Ahn
(74) *Attorney, Agent, or Firm* — Dorsey & Whitney LLP

(57) ABSTRACT

A method of digitally controlling a timing recovery loop to control jitter and reduce word-length in a recovered clock is provided. A timing error detector provides an output identifying the error sign. First and second randomizing digital attenuators provide first and second estimates of the phase error in a timing signal. A controller receives the first estimate and provides a signal to an NCO. An output from the NCO provides feedback to the error detector to complete a first order feedback loop, providing a first estimate phase error compensation. An integrator receives the second estimate and provides an output estimate for frequency offset of the timing signal that is received by the controller and the sign and magnitude of the integrated phase error are calibrated to provide a frequency offset. The controller determines a number of additional updates to the NCO required to minimize jitter and reduce word-length.

22 Claims, 3 Drawing Sheets

METHOD FOR FREQUENCY COMPENSATION IN TIMING RECOVERY

CROSS-REFERENCE TO RELATED APPLICATIONS

This application is cross-referenced to and claims the benefit from U.S. Provisional Patent Application 60/900,180 filed Feb. 7, 2007, which is hereby incorporated by reference.

FIELD OF THE INVENTION

The invention relates generally to timing recovery in electronic communication systems. More particularly, the invention relates to a method of using an analog phase interpolator to recover and generate timing recovery loop receive-frequency offset compensation.

BACKGROUND

Receivers for electronic communication systems require adaptive timing recovery loops to derive a receiver sampling clock that is used to minimize the receive signal error. As part of this process, the receive-clock must compensate for the frequency offset between the far end transmitter and the local reference clock. Typically, the frequency offset is in the range of a few hundred parts per million (PPM), such that the receiver clock frequency must be adjusted to a very low rate relative to the actual frequency of the clock. Traditionally, this is done by using a receive phase locked loop (PLL) with a voltage controlled oscillator (VCO), where the VCO frequency can be accurately trimmed by small variations in a control voltage.

In general, since the receiver must adapt to the errors in both phase and frequency, a $2^{nd}$ order timing recovery loop is required. In addition, many systems require extremely low receiver phase error, also known as jitter, to minimize the receiver signal to noise ratio (SNR) degradation due to crosstalk and other high-pass type impairments. In analog timing recovery systems, where the main pole is realized with a voltage controlled oscillator (VCO) or a voltage controlled crystal oscillator (VCXO), improvements in oscillator technology have helped to reduce the inherent phase noise in such systems. In a digital timing recovery system, where the pole is often realized with a numerically controlled oscillator (NCO), low jitter can be achieved by decreasing the step size in the NCO (e.g. lowering it's gain), and by limiting the rate and size of updates to the NCO.

FIG. 1 shows a typical timing recovery loop 100 having a timing error detector 102, a loop filter 104, a controller 106 and a numerically controlled oscillator (NCO) 108. Here, the NCO 108 is realized by a phase accumulator (not shown), which has the transfer function:

$$H(z)=(1/N)\times[1/(1-z^{-1})],$$

and an address generator (not shown) configured such that the output phase is a linear function of the input address. The controller 106 is used to transform the loop filter output 110 into a specific address for the NCO 108, where the loop filter input 112 is results from the output of the timing error detector 102.

FIG. 2 shows a typical loop filter 104 having a digital integrator 200, three multipliers 202a, 202b, and 202c having unique gain values a, b and c, respectively, where gain value a is the gain of the multiplier 202a in the linear path, gain value b is the gain of the multiplier 202b in the integration path and gain value is the gain of the multiplier 202c after the output of the unit delay element 206 and before the second summing node 200. An accumulator 204 is configured as a proportional+integral filter. When used in a loop 100 shown in FIG. 1, the unit delay element 206 of the structure 104 is a linear combination of the instantaneous phase error 110 having an output:

$$y(z)=(b+a)-(a\times c\times z^{-1})/[1-(c\times z^{-1})],$$

such that the value Y(z) (referred to as 110 in FIG. 2) typically has a wide dynamic range. In order to minimize jitter, it is desirable to minimize the difference between successive output phases, thus the NCO 108 is designed to be driven by a low-precision input signal that simply increments or decrements the output phase by the step size of the (stepped) NCO 206, that is:

Phase step size~(1/n), or phase(n)=phase($n^{-1}$)+(U)×phase step, where U is a singed integer scale factor.

Typically the operation of translating the wide dynamic range phase error estimate 110 into a sequence of increment/decrement pulses for the NCO 108 is performed by some pulse width modulation technique such as a slope intersect method, a delta method or a sigma-delta method.

Alternative timing recovery architectures that employ delay locked loops (DLL) can also be employed for this operation. However, because such circuits use delay lines of phase interpolators rather than VCO's, in such a manner that the frequency of the main reference clock dose not need to be changed, such systems require additional circuitry to control the receive clock frequency.

Accordingly, what is needed is a method to digitally control the timing recovery to minimize (and control) jitter in the recovered clock, with reduced word-length requirements and does not require additional circuitry to control the receive clock frequency.

SUMMARY OF THE INVENTION

The current invention provides a method of digitally controlling a timing recovery loop to control jitter in a recovered clock and reducing word-length requirements. The method includes a timing error detector that provides an output identifying the sign of the timing error, where the sign is a Boolean data-type. A first randomizing digital attenuator is included to provide a first estimate of an instantaneous phase error in a timing signal. A second randomizing digital attenuator is included to provide a second estimate of the instantaneous phase error in the timing signal. A controller is provided that is disposed to directly receive the first estimated phase error. A numerically controlled oscillator is provided that is disposed to directly receive an output signal from the controller, where an output signal from the oscillator is disposed to directly provide feedback to the error detector and first order feedback loop is completed to provide a phase error compensation for the first estimate of the phase error. An integrator is provided that is disposed to directly receive the second estimated phase error, where an output of the integrator provides an estimate for a frequency offset of the timing signal. The estimated frequency offset is directly received by the controller, where the sign and magnitude of the integrated phase error are calibrated to provide a frequency offset. The controller determines a number of additional updates to the numerically controlled oscillator that are required to minimize jitter and reduce word-length requirements.

In one aspect of the invention, the timing recovery loop includes a pulse stretcher within a receive phase locked loop controller of the timing recovery loop. According to one aspect of this embodiment, the pulse stretcher reads an output from a frequency offset accumulator and the accumulator output is converted into a sequence of pulses. The pulse sequence is added to the output of a linear path spanning from the input to the output of the receive phase locked loop controller.

In another aspect, the frequency offset accumulator may be periodically updated to provide low rate tracking of frequency drift.

In a further aspect, the pulse stretcher is configured to provide a randomized sequence of update pulses to the NCO such that the power of the discrete tones in the recovered clock are minimized.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

Figure 1:
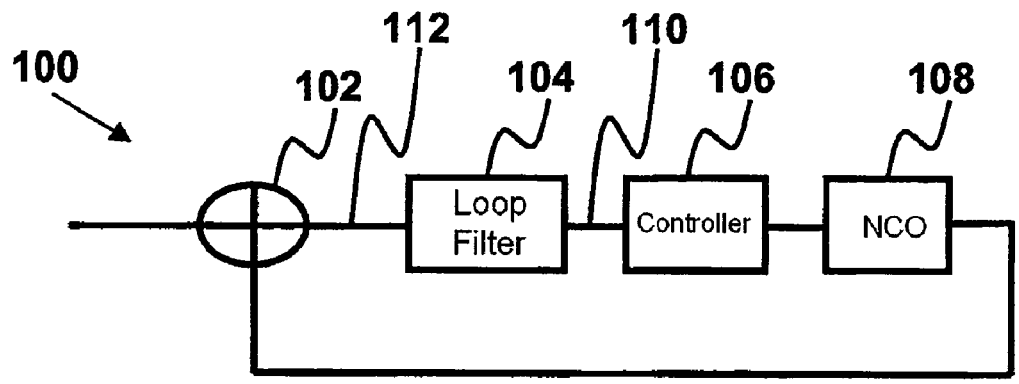
FIG. 1 shows a schematic drawing of a prior art digital timing recovery loop.
Figure 2:
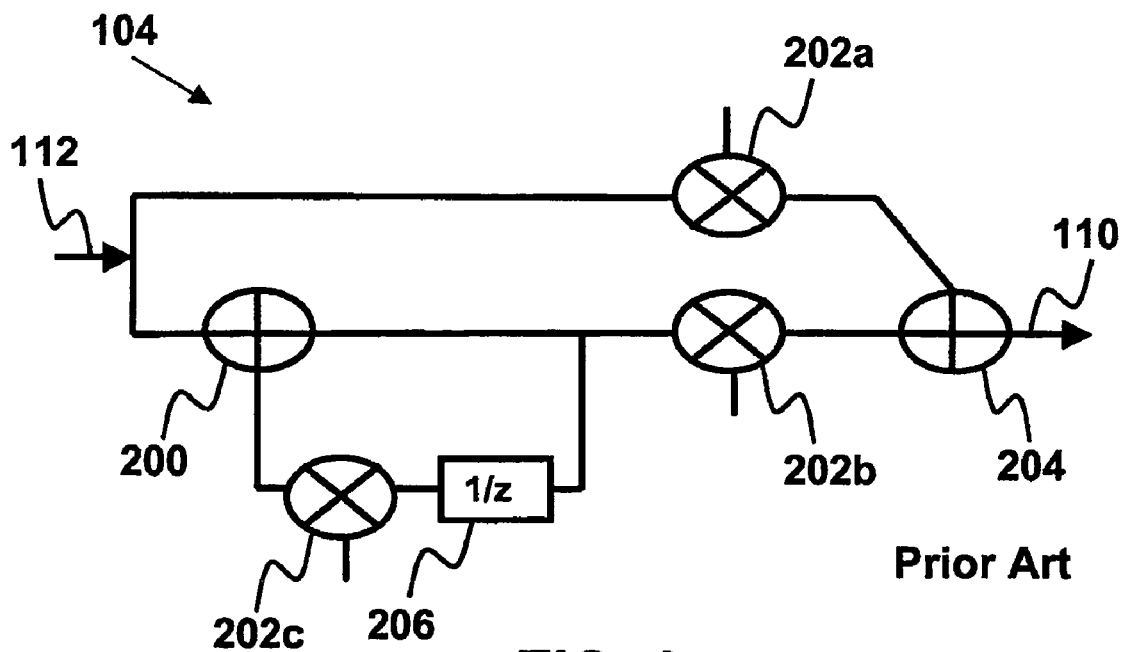
FIG. 2 shows a schematic drawing of a prior art loop filter.
Figure 3:
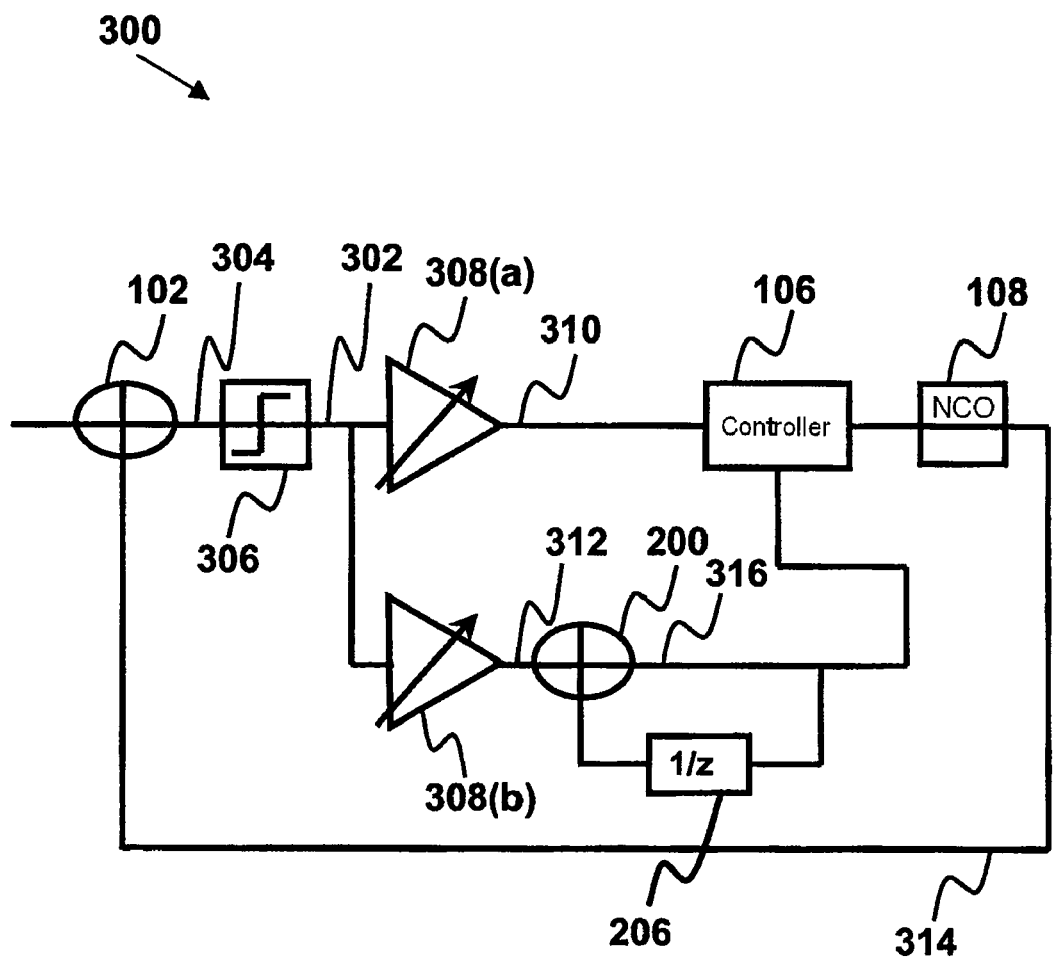
FIG. 3 shows a schematic drawing of a timing recovery loop filter according to the current invention.

Referring now to the figures, FIG. 3 shows a schematic view of a timing recovery loop 300 according to the current invention. In this loop 300 the dynamic range requirements are reduced by using only the sign 302 of the timing error estimate 304, as realized by a sign interpreter 306. Programmable randomizing digital attenuators 308 (a, b) are used to create two different instantaneous phase error estimates 310 and 312, respectively. The estimate 310 is fed directly to the controller 106 and completes a first order feedback loop 314, suitable for phase error compensation. The estimate 312 is integrated by an integrator 200' and creates a frequency-offset estimate 316. One key aspect of the invention is that the sign and magnitude of the integrated phase error can be calibrated such that it describes the frequency offset 316. Thus the controller 106, by reading this value, can determine how many additional updates to the (stepped) NCO 208 are required. For example, if the gain of the timing error detector 102 and the RDA 308 are selected such that an offset frequency of (X) PPM creates a value of (n) at the output 316. Then, based on the step size (1/n) of the (stepped) NCO 208, the controller 106 determines from the value of the frequency-offset estimate 316 the number of extra updates to the (stepped) NCO 208 are required within a pre-determined period of time to compensate for the frequency offset.

Advantages of the current invention include reduced jitter by providing a lower required update rate to the NCO 108, as opposed to the rate required with a sigma-delta type modulator. A further advantage is reduced word length requirements when compared to a typical loop, where, according to the current invention, the proportional path is realized with two bits and the proportional path can be realized in fewer that 8-bits. This leads to a lower power implementation than traditional methods. A further advantage of the current invention is that the controller 106 can be configured to control the spectrum of the update signals provided to the NCO 108 and thus the spectrum of the recovered clock 314.

Figure 4:
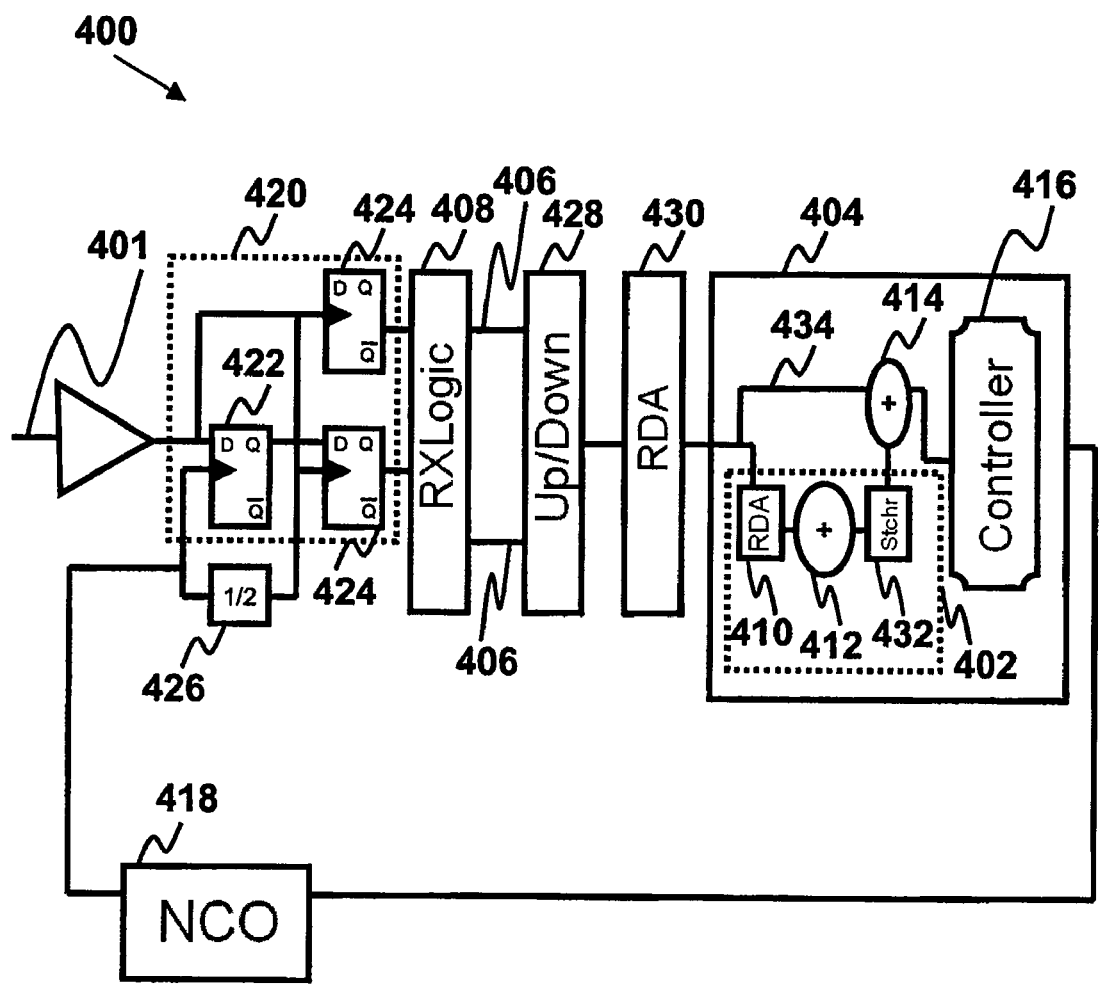
FIG. 4 shows a block diagram of the receive timing recovery loop according to the current invention.

FIG. 4 shows a high-level block diagram of the receive timing recovery loop 400 according to one embodiment of the invention. In order to handle a frequency offset of +/−200 PPM, the receive timing recovery must be converted into a second order system. This is accomplished by adding a frequency compensation path 402 to the receive phase locked loop controller (RPLLC) 404. This path takes the sliced phase error information 406 from the receive logic (RXLOGIC) 408 and applies the sliced phase error slice 406 to a randomizing digital attenuator (RDA) 410 of variable length, and a counter 412. The counter 412 serves as an integrator in the loop 402. The output of the counter 412 is then evaluated and converted into a quasi-periodic sequence of increment of decrement pulses that are used to drive the main error counter 414 in parallel with the linear path. Also shown are the controller 416 of the RPLLC 404, the NCO 418, a master-slave D flip-flop 420 arrangement including a master D flip-flop 422 having a receive signal 401 provided to the input of the D flip-flop 422 and is disposed to drive a pair of slave flip-flops 424, where a clock delay 426 is disposed between the inputs of the master 422 and slaves 424. The output of the slave flip-flops 424 is input to the RXLOGIC 408 and the output from the RXLOGIC 408 is fed to an UP/DOWN generator 428. The resulting signal from the UP/DOWN generator 428 is fed to a first RDA 430.

One key aspect of the frequency compensation loop 402 is the design of the pulse-stretcher 432. This circuit reads the frequency offset accumulator output 412 and converts this number into a sequence of pulses that are added to the linear path output 434. In order to minimize jitter and phase error due to frequency offset, this block 402 should create a sequence of pulses that represents the quasi-dc accumulator output 412. The pulse sequence can be designed either as a random or quasi-periodic sequence as required to minimize SNR degradation in a particular application.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example the phase detector may be realized as either a linear or non-linear circuit. In the case of a linear phase detector, further processing is required to convert the wide dynamic range linear output to a pulse-density modulation signal. In a further variation, the phase detector may accept inputs from multiple receiver channels providing a single frequency offset estimate for parallel channel communications systems such as giga-bit ethernet.

All such variations are considered to be within the scope and spirit of the present invention as defined by the following claims and their legal equivalents.

What is claimed:

1. A method of adjusting an output signal generated by an oscillator, the method comprising:

detecting a timing difference between an incoming signal and the output signal generated by the oscillator;

generating a first signal using a first randomizing digital signal attenuator, wherein the first signal is based, at least in part, on the timing difference, and wherein said generating a first signal includes providing an indication of the sign of the timing difference to the first randomizing digital attenuator;

generating a second signal using a second randomizing digital attenuator, wherein the second signal is based, at least in part, on the timing difference, and wherein said generating a second signal includes providing an indication of the sign of the timing difference to the second randomizing digital attenuator;

integrating the second signal to generate an integrated signal; and generating control signals for the oscillator based, at least in part, on the first signal and the integrated signal.

2. The method of claim 1, wherein the second signal is different from the first signal.

3. The method of claim 1, wherein said detecting a timing difference comprises detecting a sign of the timing difference.

4. The method of claim 3, wherein said generating a first signal comprises generating the first signal based on the sign of the timing difference.

5. The method of claim 1, wherein the indication of the sign of the timing difference is less than eight bits in length.

6. The method of claim 1, wherein the indication of the sign of the timing difference is two bits in length.

7. The method of claim 1, wherein the second signal is based, at least in part, on the timing difference at a first time, and wherein said integrating the second signal comprises:
delaying the second signal to generate a delay signal;
generating a new second signal based, at least in part, on a timing difference between the input signal and the output signal at a second time; and
adding the delay signal and the new second signal.

8. The method of claim 1, wherein the oscillator comprises a numerically controlled oscillator, and wherein the control signals comprise increment or decrement pulses.

9. The method of claim 1, wherein the first signal is indicative of a phase difference between the input signal and the output signal, and wherein the integrated signal is indicative of a frequency offset between the input signal and the output signal.

10. A timing recovery loop comprising:
an error detector configured to generate an instantaneous error signal indicative of a timing difference between an input signal and a feedback signal;
a first randomizing digital attenuator configured to receive the instantaneous error signal and generate a first randomized digital signal based, at least in part, on the instantaneous error signal;
a second randomizing digital attenuator configured to receive the instantaneous error signal and generate a second randomized digital signal based, at least in part, on the instantaneous error signal;
an integrator configured to receive the second randomized digital signal and generate an integrated signal based, at least in part, on an integral of the second randomized digital signal;
a controller configured to receive the instantaneous error signal and the integrated signal, wherein the controller is further configured to generate oscillator control signals based, at least in part, on the instantaneous error signal and the integrated signal; and an oscillator configured to receive the oscillator control signals and generate the feedback signal based, at least in part, on the oscillator control signals.

11. The timing recovery loop of claim 10, wherein the error detector comprises a sign interpreter, and wherein the instantaneous error signal is indicative of a sign of the timing difference between the input signal and the feedback signal.

12. The timing recovery loop of claim 11, wherein the instantaneous error signal is less than eight bits in length.

13. The timing recovery loop of claim 11, wherein the instantaneous error signal is two bits in length.

14. The timing recovery loop of claim 10, wherein the oscillator control signals are configured to reduce the timing difference between the input signal and the feedback signal.

15. The timing recovery loop of claim 10, wherein the oscillator control signals comprise a plurality of pulses, and wherein the controller is further configured to generate the pulses as either a random or quasi-periodic sequence.

16. The timing recovery loop of claim 10, wherein the integrator comprises a delay element configured to delay the instantaneous error signal and a summer configured to combine the delayed instantaneous error signal with a subsequent instance of the instantaneous error signal.

17. A receiver comprising:
an input terminal configured to receive an input signal transmitted in accordance with a first clock signal;
an oscillator configured to generate a second clock signal; and
a timing recovery loop configured to compensate for a timing difference between the first clock signal and the second clock signal, wherein the timing recovery loop includes:
an error detector configured to generate an instantaneous error signal indicative of the timing difference between the first clock signal and the second clock signal;
a first randomizing digital attenuator configured to receive the instantaneous error signal and generate a first randomized digital signal based, at least in part, on the instantaneous error signal;
a second randomizing digital attenuator configured to receive the instantaneous error signal and generate a second randomized digital signal based, at least in part, on the instantaneous error signal;
an integrator configured to receive the second randomized digital signal and generate an integrated signal based, at least in part, on an integral of the second randomized digital signal; and
a controller configured to receive the instantaneous error signal and the integrated signal, wherein the controller is further configured to generate oscillator control signals based, at least in part, on the instantaneous error signal and the integrated signal;
wherein the oscillator is further configured to adjust a phase, a frequency, or both of the second clock signal based, at least in part, on the oscillator control signals.

18. The receiver of claim 17, wherein the error detector comprises a sign interpreter, and wherein the instantaneous error signal is indicative of a sign of the timing difference between the first and second clock signals.

19. The receiver of claim 18, wherein the instantaneous error signal is less than eight bits in length.

20. The receiver of claim 18, wherein the instantaneous error signal is two bits in length.

21. The receiver of claim 17, wherein the oscillator control signals comprise a plurality of pulses, and wherein the controller is further configured to generate the pulses as either a random or quasi-periodic sequence.

22. The receiver of claim 17, wherein the integrator comprises a delay element configured to delay the instantaneous error signal and a summer configured to combine the delayed instantaneous error signal with a subsequent instance of the instantaneous error signal.

* * * * *